United States Patent [19]
Ostman et al.

[11] 4,085,502
[45] Apr. 25, 1978

[54] JUMPER CABLE

[75] Inventors: Barry I. Ostman, Merrimack; Joseph A. Roberts, Hudson, both of N.H.

[73] Assignee: Advanced Circuit Technology, Inc., Merrimack, N.H.

[21] Appl. No.: 786,886

[22] Filed: Apr. 12, 1977

[51] Int. Cl.² .............................................. H02G 15/00
[52] U.S. Cl. ...................................... 29/629; 29/624;
156/55; 156/630; 156/634; 156/659; 156/664;
174/88 R; 174/117 FF; 204/15; 204/32 R;
339/17 F; 339/29 R
[58] Field of Search ................. 29/624, 625, 627, 628,
29/629, 630 R; 113/119; 156/659, 661, 664,
630, 634, 50, 47, 55, 309; 174/68.5, 74 R, 75 R,
36, 84 R, 88 R, 88 C, 70 C, 110 R, 117 F, 117
FF; 204/15, 32 R; 219/528, 549; 427/96, 404,
405; 339/17 F, 17 R, 17 E, 29 R, 176 MF, 214
R; 333/84 M, 84 R

[56] References Cited
U.S. PATENT DOCUMENTS

| 2,973,502 | 2/1961 | Tally ............................. 339/17 F X |
| 3,079,458 | 2/1963 | Hedstrom .............................. 29/628 |
| 3,168,617 | 2/1965 | Richter .............................. 339/17 F |
| 3,264,152 | 8/1966 | Haydon ............................. 29/625 X |
| 3,391,246 | 7/1968 | Freeman et al. .............. 174/117 FF |
| 3,547,718 | 12/1970 | Gordon ..................... 174/117 FF X |
| 3,601,755 | 8/1971 | Shiells, Jr. ..................... 339/17 R X |
| 3,808,679 | 5/1974 | Dalmasso .............................. 29/625 |
| 3,888,745 | 6/1975 | Hojyo ..................................... 204/15 |
| 4,019,798 | 4/1977 | Zielinski ............................. 339/17 F |

OTHER PUBLICATIONS

IBM Tech Disclosure Bulletin, Cable Fabrication, B. W. Davis et al., vol. 6, No. 1, June 1963, p. 8.

*Primary Examiner*—Victor A. DiPalma
*Attorney, Agent, or Firm*—Schiller & Pandiscio

[57] ABSTRACT

An electrical jumper cable comprising a plurality of spaced metallic conductors, each conductor having a flexible area and integrally formed rigid terminal ends, is provided. Starting with a metallic sheet having a thickness approximating that required for the conductor flexible areas, one or more mesas of thickness approximating that required for the terminal ends are formed on the edge regions of the sheet. The mesas may be formed by plating or casting so that the thickened edge regions are integral with the sheet central region. The resulting substrate is then chemically or mechanically milled so as to define the conductor patterns and terminal ends, and the metallic conductors laminated to flexible films so as to support and maintain the metallic conductors in spaced relation to one another.

14 Claims, 16 Drawing Figures

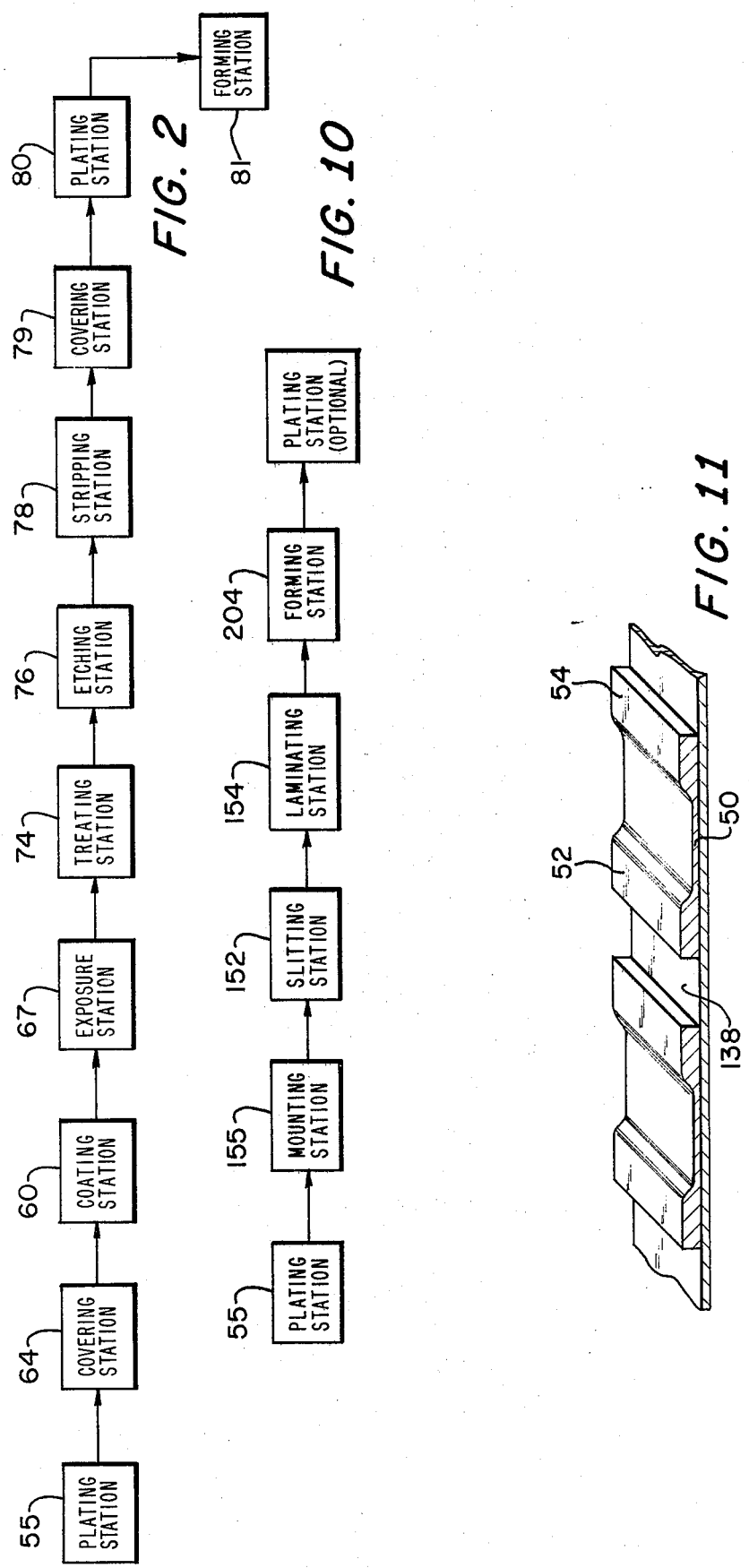

JUMPER CABLE

This invention relates to electrical connecting devices and to methods of manufacturing the same, and more particularly to improvements in multiple conductor jumper cables and to methods for manufacturing the same.

Various flat multiple conductor jumper cables are well known in the art and are available commercially. At the current state of the art a principal obstacle to wide spread adoption of multiple conductor jumper cables is the relatively high manufacturing cost due primarily to direct labor costs. Another factor limiting wide spread adoption of multiple conductor jumper cables is the inability of the art to simply and economically produce jumper cables to custom designs.

Shiells U.S. Pat. No. 3,601,755 proposes forming a multiple conductor jumper cable starting with conventional round wire. According to Shiells areas of the round wires between the wire ends are rolled flat so as to increase flexibility of the wires in the flattened areas, while the unflattened ends of the wires remain sufficiently strong and rigid to permit direct connection without the need of a special connector assembly. For cabling, Shiells then assembles a plurality of flattened wires in generally parallel spaced relationship and bonds the assembled wires to a plastic laminate. An obvious disadvantage of the Shiells method is the requirement of precision aligning the individual wires which may be somewhat difficult and may add appreciably to production costs. Also, contact design and conductor terminal location are severely limited by the Shiells method.

Another prior art method for forming multiple conductor jumper cables is taught by Key U.S. Pat. No. 3,731,254. Key discloses a jumper cable comprising a flat multi-conductor cable terminated at opposite ends by L-shaped stamped metal terminal posts assembled in a dielectric housing. Fabrication of the jumper cable disclosed by Key and attachment of the individual terminal posts requires a number of separate precision steps which may add appreciably to manufacturing costs. Another disadvantage of the jumper cable disclosed by Key is the possibility of failure of the connections between the conductor cable and the terminal posts.

Still another method for forming multiple conductor jumper cables is disclosed by Ostman, U.S. application Ser. No. 786,887, filed concurrently herewith, and assigned to the common assignee. Ostman discloses forming a jumper cable comprising a plurality of spaced metallic conductors including one or more flexible areas and integral rigid terminals, from a relatively rigid metallic sheet by selectively reducing the sheet in cross-section so as to define the conductor patterns and terminal ends and to render flexible, (at areas of reduced cross section), areas of the conductors, and laminating the metallic conductors to flexible insulating films to support the conductors and to maintain them in spaced relation to one another. According to Ostman the metallic sheet preferably initially has a thickness substantially equal to that required for the terminal ends. Ostman also notes that it is also possible to start with a metallic sheet somewhat thinner than that required for the terminal ends, process as before, and then plate additional metal onto the terminal ends to achieve a required thickness.

It is a principal object of the present invention to provide a novel, multiple conductor jumper cable having a flexible central portion and rigid terminal ends. Another object of the present invention is to provide a relatively simple and inexpensive method for producing a cable of the type above described. Yet other objects of the present invention will in part appear obvious and will in part appear hereinafter.

The invention accordingly comprises the process and the several steps and the relation of one or more of such steps with respect to each of the others, and the product possessing the features, properties and relation of components which are examplified in the following detailed disclosure and the scope of the invention all of which will be indicated in the claims.

Generally, in accordance with the present invention a jumper cable comprising a plurality of spaced metallic conductors including integral rigid terminal ends and one or more flexible areas intermediate the ends is formed as follows: Starting with a metallic sheet having a thickness approximately that required for the conductor flexible areas, one or more mesas of thickness approximating that required for the terminal ends are formed on the edge regions of the sheet. The mesas may be formed by plating or casting so that the thickened edge regions are integral with the sheet central areas. The resulting contoured substrate is then chemically or mechanically milled so as to define the conductor patterns and terminal ends. The metallic conductors are laminated between flexible insulating films which support and maintain the metallic conductors in spaced relation to one another.

For a further understanding of the nature and objects of the present invention, reference should be had to the following detailed description taken in connection with the accompanying drawings wherein like numbers depict like parts, and:

FIG. 2 is a side elevational view, diagrammatically illustrating a process for producing the jumper cable of FIG. 1 in accordance with the teachings of the present invention;

FIG. 10 is a side elevational view diagrammatically illustrating an alternative process for producing the jumper cable of FIG. 1 in accordance with the teachings of the present invention;

FIG. 11 is a perspective view of jumper cable at an early stage of formation in accordance with the process of FIG. 10;

As used herein the terms "rigid" and "flexible" are employed in their relative sense and with regard to an intended utility. For example when the term "flexible"

is used for describing selected areas of jumper cable in accordance with the invention, it is intended that the jumper cable have, at such areas, the capacity to be bent, or twisted within predetermined limits without fracture or fatigue. The particular circuit design will determine the required degree of flexibility. The term "rigid" as applied to the cable terminals is intended that the terminals are sufficiently stiff and rigid to permit direct assembly and connection of the terminals (e.g. as by mass wave soldering) to a circuit board.

Figure 1:
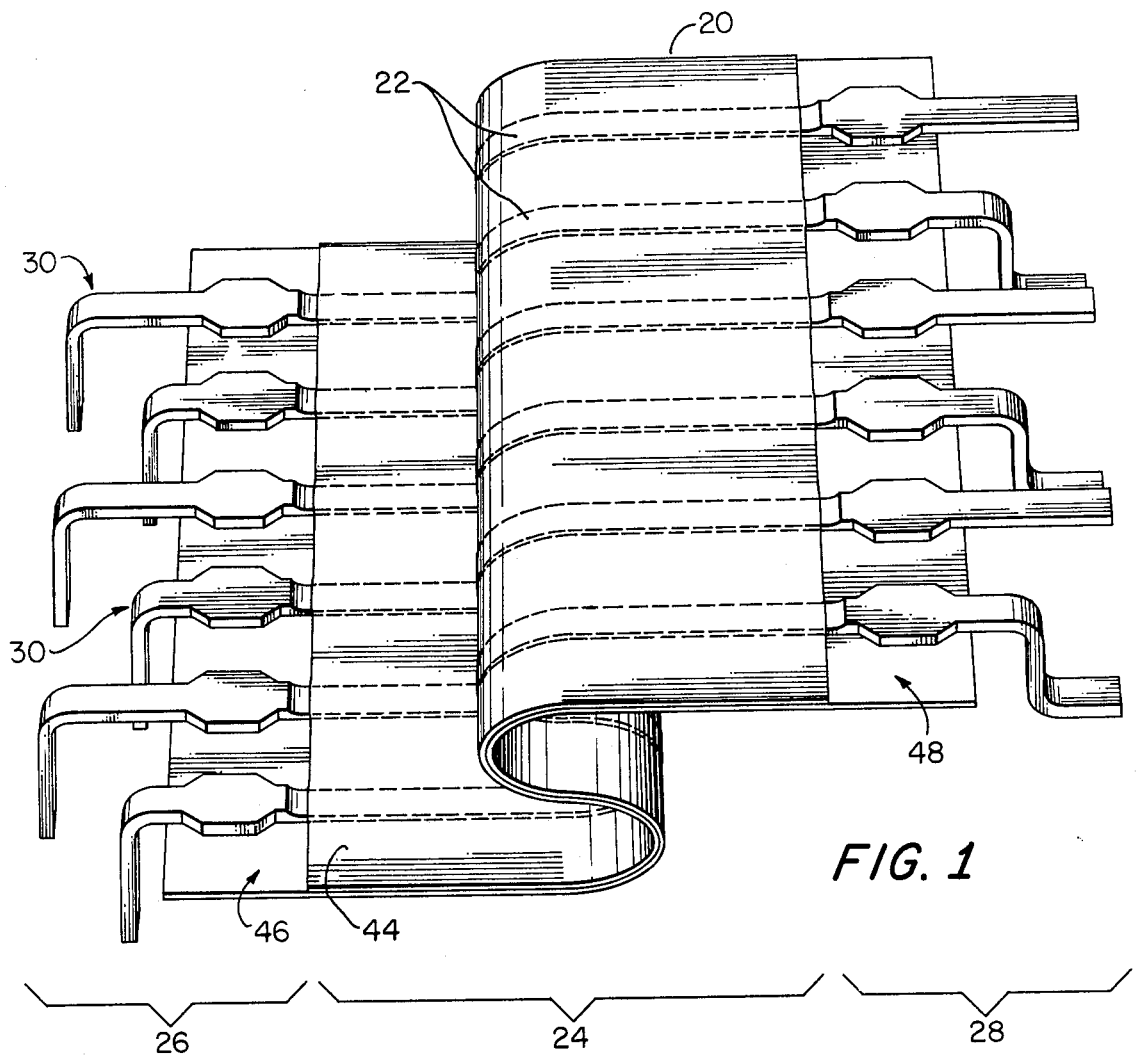
FIG. 1 is a perspective view of one form of multiple conductor jumper cable constructed in accordance with the present invention.

One embodiment of jumper cable in accordance with the present invention is shown in FIG. 1 of the drawings. Referring to FIG. 1, for illustrative purposes the jumper cable 20 is shown comprising six spaced metallic conductors 22. It will be understood however, that the jumper cable may comprise any number of conductors as may be desired. Each conductor 22 comprises a flexible central portion 24 extending between rigid terminal ends 26 and 28. Conductors 22 have dimensions, and shapes corresponding to the required design criteria, e.g. current carrying capacity, flexibility requirements, and cable geometry. Typically, those portions of conductors 22 which are intended to be flexible will have a thickness in the range of 0.03 to 0.1 mm., depending on the degree of flexibility required and the hardness of the metal. Terminal ends 26 and 28 typically will have a thickness in the range of 0.2 to 1.0 mm. or more, depending on the degree of stiffness required and the hardness of the metal.

Figure 16:
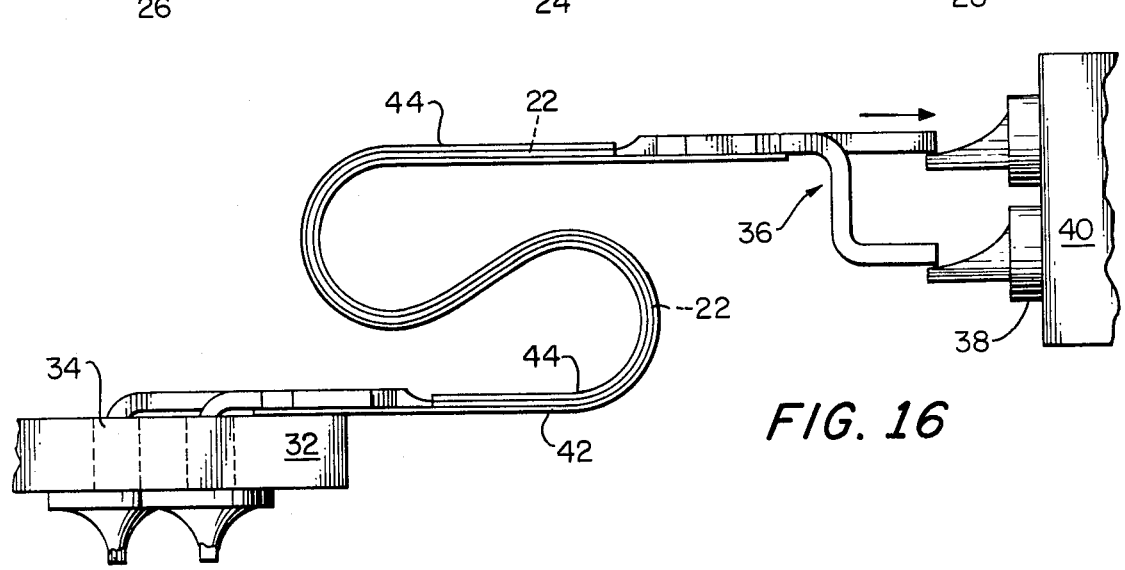
FIG. 16 is a side elevational view of a jumper cable made in accordance with the present invention, and showing exemplary modes of connection.

As seen in FIGS. 1 and 16, terminal ends 26 and 28 are integral extensions of the conductor central portions 24. Terminal ends 26 and 28 may be formed or shaped for the particular connection purpose required. Thus for example, terminal ends 26 may be bent at right angles at 30 for insertion into apertures 34 in a circuit board 32, while terminal ends 28 may be bent and formed as at 36 for connection to solder cups 38 of connector 40 (FIG. 16). Preferably the terminals are offset from one another as shown so as to provide greater isolation between adjacent connection points. Obviously terminal ends 26 and 28 will be sized and spaced to meet design criteria for custom application or for mating with standard terminal connectors. The manner by which the terminal ends are formed will be described in detail hereinafter.

The individual conductors 22 are supported and maintained in spaced relation to one another by sandwiching the conductors 22, between first and second dielectric films 42 and 44, respectively. As seen in FIG. 1, film 42 is bonded to the bottom surface of conductors 22, and preferably also extends partially under the terminal ends, e.g. as at 46 and 48. Film sheet 44 is bonded across the top surface of conductors 22, and may extend over the terminal ends (46, 48). Films 42 and 44 are also bonded to each other in the areas between conductors 22. Films 42 and 44 preferably are formed of an electrically insulating polymeric film material such as a polyester, polypropylene, polyimide, cellulose triacetate, polyethylene terephthalate or other readily available flexible film. The film thickness is not critical to the invention and will depend upon the particular film or films employed, required degree of flexibility and electrical insulation requirements. Films 42 and 44 may be bonded to conductors 22 by adhesive means such as a thermoplastic or thermosetting adhesive, or one or both of films 42 and 44 may be formed in-situ on the conductors as by casting in known manner.

The present invention is predicated in part on mass forming a plurality of metallic conductors from a contoured, metallic substrate by selectively reducing the substrate in cross-section so as to define the conductor patterns and integral rigid terminal ends. The metallic substrate may be reduced by chemical milling, e.g. etching, or by mechanical milling, e.g. grinding or skiving, precision die cutting, or a combination of one or more milling, etc. techniques.

One method of forming a flexible jumper cable in accordance with the present invention is described below:

FIGS. 2–9 illustrate the formation of a flexible jumper cable in accordance with the present invention employing chemical milling techniques.

Figure 3:
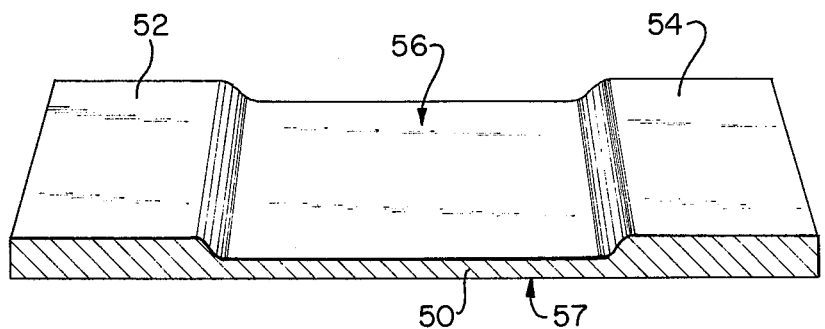
FIGS. 3–8 are perspective views of jumper cable at various stages of formation in accordance with the process of FIG. 2.

A metallic substrate or sheet 50 preferably of thickness substantially equal to that required for the flexible areas of the completed cable is provided. In the illustrated case the metallic sheet initially comprises 0.075 mm. thick copper. Thereafter as shown in FIG. 3 mesas 52 and 54 are formed on the opposite edges sheet 50 by selectively plating the sheet, in known manner, at a plating station 55. Mesas 52 and 54 should have a thickness approximating that required for the terminal ends of the completed cable. For example, for producing jumper cables having rigid terminal ends of about 0.25 mm. thickness, mesas 52 and 54 should have a thickness of about 0.25 mm.

Figure 4:
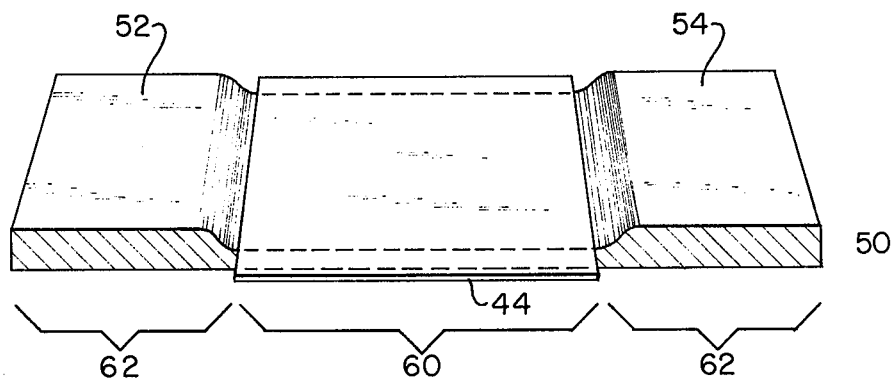

The next step is to cover partially one side (e.g. side 56) of substrate 50 with a thin, flexible insulating film such as 3 mil polyimide film 44. As shown in FIG. 4, film 44 is cut to a size and shape so as to cover the relatively thin central portion 60 of substrate 50, but leaving uncovered the relatively thick mesa portions 62. Film 44 is applied to substrate 50 at covering station 64 (FIG. 2), and bonded to the substrate 50 by means of a suitable adhesive such as a thermoplastic or thermosetting adhesive.

Figure 5:
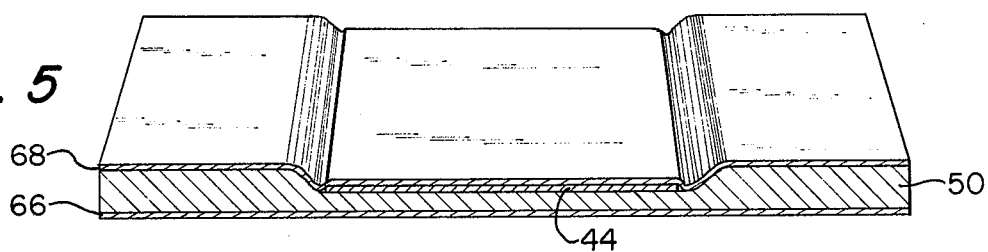

Substrate 50 is then passed to a coating station 60 where both surfaces 56 and 57 of the substrate, and also film 44 are covered with layers of conventional resist material 66 and 68 (FIG. 5). The next step involves exposing one of the resist layers to a negative pattern so as to define desired conductor patterns 70, and also a border area 72. The purpose of border area 72 will become clear from the description following. Simultaneously the entire layer 68 is also exposed to light. The areas of resist coating 66 and 68 exposed to light are altered to a lower molecular weight polymer. The sheet substrate is then immersed in a preferential solvent or developer at a treating station 74, with the result that the exposed areas of layer 66 and layer 68 remain intact while the unexposed areas of layer 66 are dissolved away exposing surface 57 (see FIG. 6).

Figure 6:
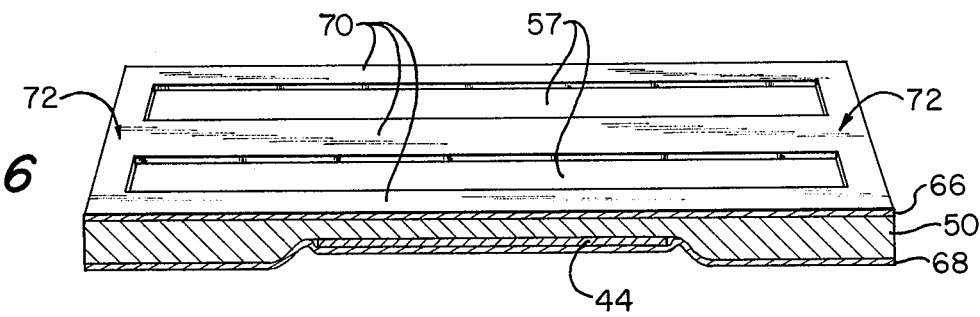
Figure 7:
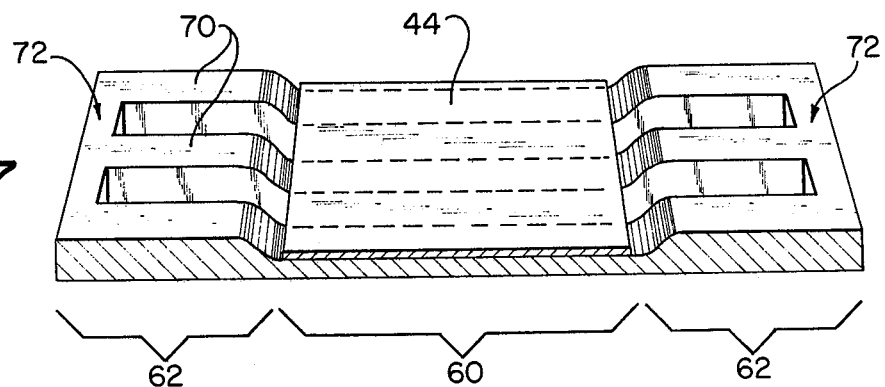

The next step involves chemically milling the exposed metallic areas by contacting the FIG. 6 coated substrate with an acid etching solution at an etching station 76. Etching is continued until breakthrough occurs. At this point the conductor patterns and the relative thicknesses of the conductor flexible central portions and rigid terminal ends are determined. Both sides are next stripped of all resist at a stripping station 78. The resulting structure appears substantially as shown in FIG. 7. (The structure is shown turned over for the purposes of clarity).

Figure 8:
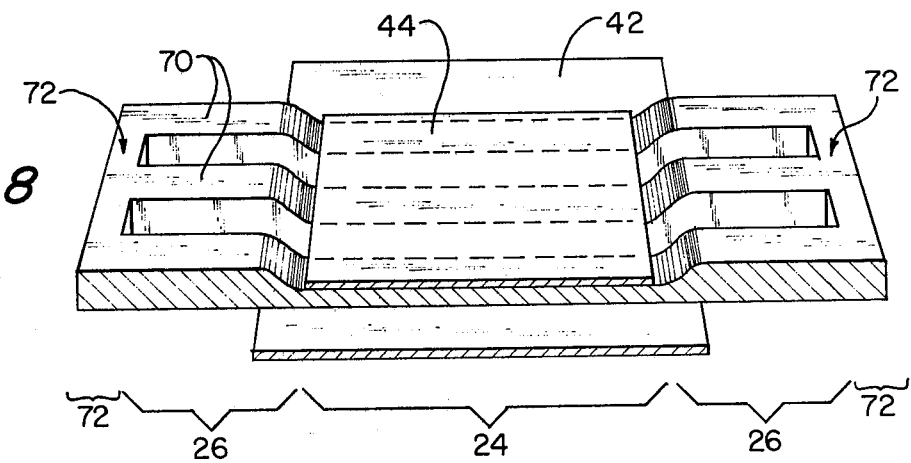

As depicted in FIG. 8, a thin insulating film such as 3 mil polyimide film 42 is then cut to size and shape and placed on the uncovered surface 57 of substrate 50 at covering station 79. Film 42 is then adhesively bonded in known manner to the conductor central portions, and to film 44. As seen in FIG. 8, the resulting structure is a metallic structure comprising a plurality of spaced conductors 70 including relatively thin central portions 24 and relatively thick end portions 26 joined at a relatively thick common border 72, and with the central portions 24 laminated between a pair of thin films 42 and 44.

Figure 9:
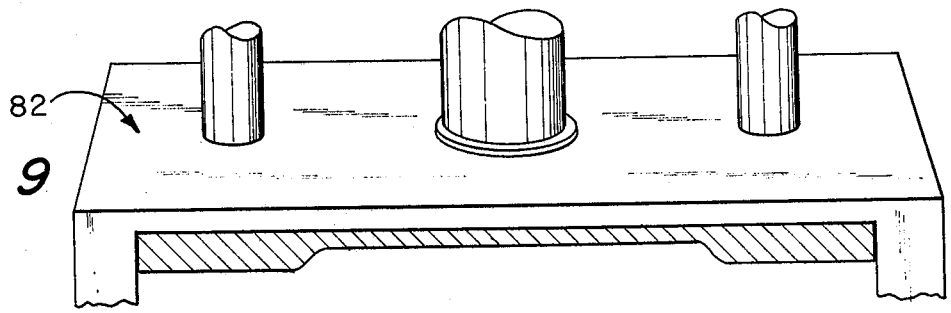
FIG. 9 is a perspective view of basic elements of a forming press useful in practicing the process of FIG. 2.

At this point the exposed areas of metal preferably are plated at a plating station 80 with a tin/lead alloy or a precious metal, using border 72 as a common bus bar. Thereafter, using border 72 for support and registration, the resulting structure is passed to a forming station 81 where end portions 26 are cut free from border 72, and the end portions 26 shaped for the desired connection purpose by means of a forming press 82 (FIG. 9). The resulting structure is a multiple conductor jumper cable in which each conductor has a central flexible area and integrally formed rigid terminal ends. It is to be understood that while only three conductors are depicted in the foregoing processing figures, sheet 50 may have a width suited to provide several jumper cables of a given number of conductors. Thus, for example, a hundred conductor wide structure can be produced for cutting, for example, into twenty jumper cables of five conductors each.

An alternative method and apparatus for producing multiple conductor jumper cable in accordance with the present invention is shown in FIGS. 10–16. The embodiment of FIGS. 10–16 is predicated upon the use of mechanical milling techniques for selectively reducing a metallic substrate to define the conductor patterns.

Figure 12:
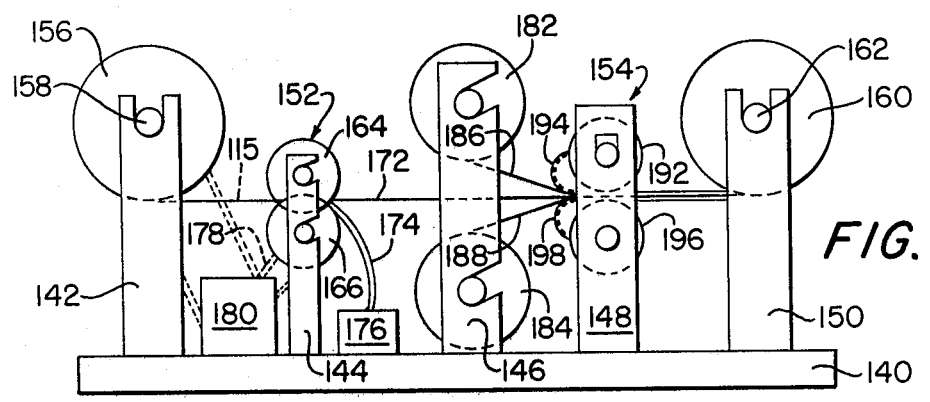
FIGS. 12–14 are side elevational views partly in section, illustrating some of the basic elements of apparatus for performing the process of FIG. 10.

Referring now to FIGS. 3 and 10–13, a metallic substrate 50 having mesas 52 and 54 is provided as before. Then a plurality of metallic substrate members 50 are mounted in spaced relation onto an elongate flexible carrier film 138 (FIG. 11) at a mounting station 155, and the resulting structure is rolled onto a reel 156 (FIG. 12.)

The next processing step is designed to produce the actual circuit pattern by defining the individual conductor width and spacing between the various conductors.

Figure 13:
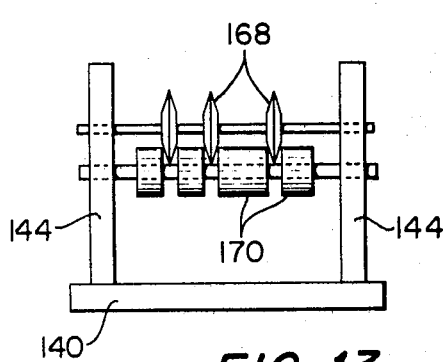
Figure 14:
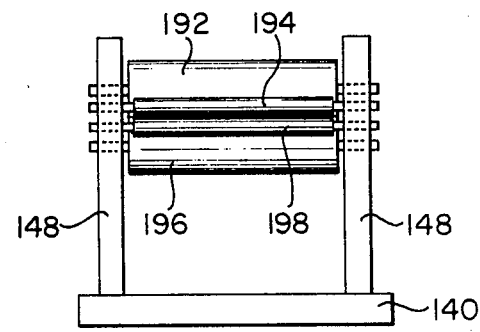

In accordance with the invention, the metallic substrates 50 are slit so as to form the individual conductors, and the conductors laminated between flexible films. These operations are accomplished in apparatus which in a preferred form as shown in FIGS. 12–14 comprises a frame having a horizontal base 140, and generally vertical paired from side members 142, 144, 146, 148 and 150 (only one of each pair as shown). Disposed within the frame are a slitting station 152 and a laminating station indicated generally at 154.

Referring in particular to FIG. 12, reel 156 is disposed adjacent the top ends of frame members 142 for rotation on a horizontal shaft 158. A take-up reel 160, is mounted adjacent the top ends of frame members 150. Reel 160 is mounted for rotation on a horizontal shaft 162.

The slitting station 152 comprises a pair of opposed cutting wheels 164 and 166, respectively, including a plurality of engaged male and female cutting dies 168 and 170, respectively (see FIG. 13). Cutting dies 168 and 170 are adapted so as to allow portions 172 of the metallic substrate (i.e. the intended circuit conductors) to pass untouched, while shearing out material between the conductors as waste 174 (see FIG. 15). The latter is collected in a waste collector 176. One or both cutting wheels 164 and 166 are mechanically connected through a drive 178 to a motor 180. Cutting dies 168 and 170 are adapted for adjustment so as to provide a predetermined number of conductors 172 of predetermined width and spacing.

Figure 15:
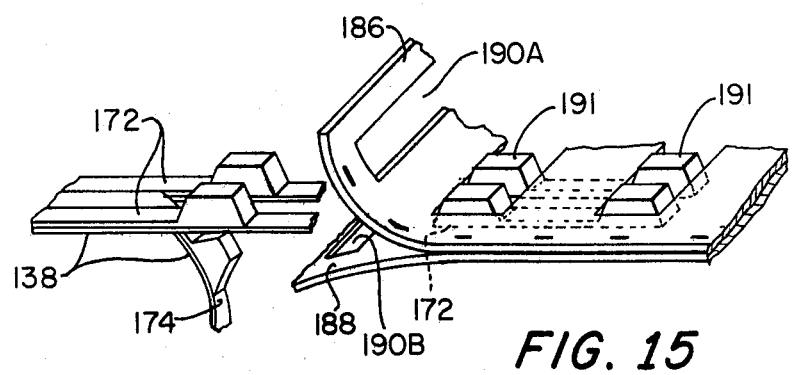
FIG. 15 is a perspective view of jumper cable at an intermediate stage of formation in accordance with the process of FIG. 10.

The laminating station 154 includes upper and lower film dispenser means 182 and 184, respectively. The latter are in the form of reels each containing a supply of flexible dielectric film 186 and 188 (e.g. 3 mil polyimide film). Referring in particular to FIG. 15, upper film 186 and lower film 188 each comprise an elongate pre-windowed continuous strip of width slightly greater than the combined width of spaced conductors 172. Both films 186 and 188 include a plurality of pre-punched slots 190A and 190B for mating the pre-windowed film with raised areas 191 of the metallic conductors. Completing the laminating station are a plurality of opposed laminating rollers 192, 196 and 194, 198, respectively. One or more of the aforesaid rollers may be driven by suitable means known in the art.

In operation, carrier film 138 is threaded through the slitting station 152 between reel 156 and reel 160. Cutting wheels 164 and 166 (which had been previously adjusted to define desired conductor width and conductor spacing) are then closed so as to pierce carrier film 138, and the film is then advanced through slitting station 152 and into laminating station 154. It should be noted that carrier film 138 is maintained under tension between reels 156 and 160 throughout the slitting step and also during the laminating step.

The laminating step is an extension of the cutting step. The slit, i.e. free floating lengths of carrier film 138 are held in tension between reels 156 and 160 and passed between the prepunched upper laminating film 186 and pre-punched lower laminating film 188. Upper laminating film 186 and lower laminating film 188 are aligned with the conductors 172 so that the flexible areas 172 of the conductors are registered between slots 190A and 190B, leaving the raised areas 191 completely free of film. The conductors and insulating films are passed between heated nip laminating rollers 192, 196 and 194, 198 respectively, where the insulating films (which had been previously coated with a thermal setting adhesive) are bonded to the conductors and each other. The resulting structure is a plurality of sets of spaced metallic conductors having bare raised "finger areas" 191 laminated between dielectric films 186 and 188 as shown in FIG. 15.

Final processing involves passing the FIG. 15 structure to a forming station 204 wherein sets of conductors may be cut from one another and the terminal ends shaped as before, by means of a forming press, e.g. press 82 (FIG. 9).

If desired the finger areas 191 may be preplated in known manner to improve solderability.

Certain changes may be made in the above apparatus and process without departing from the scope of invention herein as will be obvious to one skilled in the art. For example, precision die cutting techniques may be employed for defining the individual conductors. Moreover, mesas 52 and 54 may be formed by casting metal tabs onto the edges of sheet 50. Still other changes will be obvious to one skilled in the art, and it is therefore intended that all matter contained in the above description shall be interpreted in an illustrative and not in a limiting sense.

What is claimed is:

1. A method of forming a jumper cable having a plurality of spaced metallic conductors, each of said conductors including a pair of spaced, relatively rigid ends, and at least one region of relative flexibility between said ends and integral therewith, said method comprising the steps of:
   (A) providing a flexible metallic sheet;
   (B) forming mesas of thickness approximating that desired for said rigid ends on edge regions of said sheet;
   (C) milling said sheet so as to define said conductors and integral ends; and
   (D) covering said spaced conductors at least in part with a flexible insulating material while maintaining said conductors in spaced relation to one another.

2. A method according to claim 1, wherein said sheet comprises a metal selected from the group consisting of copper and alloys in which copper is a major constituent, and said milling comprises chemical milling.

3. A method according to claim 2 including the step of masking selected portions of said sheet so as to prevent chemical milling at said masked areas.

4. A process according to claim 1 wherein said metallic sheet materal comprises a metal selected from the group consisting of copper and alloys in which copper is a major constituent, and said milling comprises mechanical milling.

5. A method according to claim 1 including the step of plating exposed portions of said ends so as to increase the thickness of said ends and therefore the relative rigidity thereof, and to improve electrical conductivity of said ends.

6. A method according to claim 1, wherein said mesas are formed by plating edge regions of said sheet.

7. A method according to claim 1, wherein said mesas are formed by casting metal tabs onto edge regions of said sheet.

8. A method of forming a jumper cable having a plurality of spaced metallic conductors, each of said conductors including a pair of spaced, relatively rigid terminal ends of a first thickness, and at least one region of relative flexibility of a second thickness between said ends and integral therewith, said method comprising the steps of:
   (A) providing a metallic sheet of said second thickness;
   (B) forming mesas of thickness approximating said first thickness on edge regions of said sheet;
   (C) milling said sheet so as to define said conductors and integral ends; and
   (D) laminating said conductors between a pair of flexible insulating films so as to support and maintain said conductors in spaced relation to one another.

9. A method according to claim 8 including the step of shaping the ends of said conductors.

10. A method according to claim 8 wherein said spaced conductors are temporarily maintained in spaced relation by a border of said first thickness, and including the step of treating said sheet so as substantially simultaneously to remove said stabilizing border and to shape said terminal ends.

11. A method according to claim 8 wherein said milling comprises mechanical milling.

12. A method according to claim 8 wherein said milling comprises chemical milling.

13. A method according to claim 12 including the step of masking selected portions of said sheet so as to prevent chemical milling at said masked areas.

14. A method according to claim 8 including the step of plating exposed portions of said ends so as to increase the thickness of said ends and therefore the relative rigidity thereof, and to improve electrical conductivity of said ends.

* * * * *